United States Patent [19]
Cain

[11] Patent Number: 5,557,148
[45] Date of Patent: Sep. 17, 1996

[54] HERMETICALLY SEALED SEMICONDUCTOR DEVICE

[75] Inventor: Earl S. Cain, Napa County, Calif.

[73] Assignee: Tribotech, Napa, Calif.

[21] Appl. No.: 359,944

[22] Filed: Dec. 20, 1994

Related U.S. Application Data

[63] Continuation of Ser. No. 39,625, Mar. 30, 1993, abandoned.

[51] Int. Cl.⁶ .......................... H01L 23/053; H01L 23/48
[52] U.S. Cl. .......................... 257/777; 257/701; 257/737; 257/767
[58] Field of Search .................................. 257/620, 630, 257/635, 638, 751, 758, 763, 767, 786, 764, 486, 485, 701, 737, 777

[56] References Cited

U.S. PATENT DOCUMENTS

| | | | |
|---|---|---|---|
| 3,483,442 | 12/1969 | Csakvary | 257/764 |
| 3,620,827 | 11/1971 | Collet | 257/632 |
| 3,754,168 | 8/1973 | Cunningham et al. | 257/761 |
| 4,268,849 | 5/1981 | Gray et al. | 257/737 |
| 4,319,258 | 3/1982 | Harnagel et al. | 257/486 |
| 4,394,678 | 7/1983 | Winchell, II et al. | 257/764 |
| 4,680,610 | 7/1987 | Pammer | 257/737 |
| 4,927,505 | 5/1990 | Sharma et al. | 204/34.5 |
| 4,982,265 | 1/1991 | Watanabe et al. | 257/777 |
| 5,075,740 | 12/1991 | Ohtsuka et al. | 257/485 |
| 5,136,364 | 8/1992 | Byrne | 257/751 |
| 5,235,212 | 8/1993 | Shimizu et al. | 257/786 |
| 5,260,603 | 11/1993 | Kamura et al. | 257/764 |

FOREIGN PATENT DOCUMENTS 60-119755  6/1985  Japan .................................. 257/758

OTHER PUBLICATIONS

IBM TDB vol. 11 No. 9 2169 Etching Technique for Multilevel Metallurgy, Tsui pp. 1064–1065.

*Primary Examiner*—Sara W. Crane
*Assistant Examiner*—Valencia Martin Wallace
*Attorney, Agent, or Firm*—Flehr, Hohbach, Test, Albritton & Herbert

[57] ABSTRACT

A semiconductor device which includes device bonding pads exposed through oxide windows formed in a passivation oxide layer providing electrical connections to the metallized regions, a bonding pad of a different material electrically connected to the device bonding pad through a barrier layer, and a protective layer overlying the edges of said passivation oxide layer in contact with the device to seal the edges of the protective layer and a seal formed at said windows whereby the device is protected against the environment without the necessity of a separate metal or ceramic housing.

23 Claims, 15 Drawing Sheets

HERMETICALLY SEALED SEMICONDUCTOR DEVICE

This is a continuation of application Ser. No. 08/039,625, filed on Mar. 30, 1993, now abandoned.

BRIEF DESCRIPTION OF THE INVENTION

This invention relates generally to hermetically sealed semiconductor devices and to a device wherein the bonding pads of the devices are sealed.

BACKGROUND OF THE INVENTION

A major problem in semiconductor devices is protection of the bonding areas and underlying devices from the environment. The surface of devices, in the past, has been protected by oxide layers in which windows are formed to make contact to the underlying bonding pads. The complete devices usually are then sealed in a ceramic or metal housing, or given only mechanical protection by enclosing in a molded plastic package. These housings add bulk to the devices, increasing the sizes of electrical wiring assemblies and, of course, add the expense of providing such ceramic, plastic or metal housing.

To eliminate the necessity for a hermetically sealed housing, it has been proposed to seal or cocoon semiconductor devices of the type including aluminum bonding pads by applying a barrier layer to the bonding pad, followed by a layer of gold to which a gold wire lead is bonded. The barrier layer prevents the diffusion of the gold into the aluminum bonding pad. A layer of silicon dioxide is then applied to the semiconductor device, including the bonding wire. In certain instances another layer of silicon carbide titanium nitride or other layers are formed over the silicon dioxide. A major problem encountered with this technique is that cracks occur at the wire-to-gold bond layer interface with thermal changes, and thereby allow ingress of moisture, harmful gases and other contamination of the underlying semiconductor material. Furthermore, the silicon dioxide layer alone is not impermeable to certain ions which penetrate through the layer and damage the underlying devices.

OBJECTS AND SUMMARY OF THE INVENTION

It is a general object of the present invention to provide reliability without the necessity for absolute hermeticity.

It is another object of the present invention to provide an improved seal for bonding areas of semiconductor devices.

It is another object of the present invention to provide an improved cocooned semiconductor device and method of cocooning same.

It is another object of the present invention to provide a semiconductor device which is encapsulated in one or more oxide and metal layers which have openings to expose bonding pads for connection to the underlying device bonding pads and seal the edges or interfaces at the side(s) of the diced chip.

It is another object of the present invention to provide a cocooned semiconductor device which includes radiation and light shielding.

The foregoing and other objects of the invention are achieved by: a semiconductor device which includes a semiconductor body with circuit metallization carried by one or more insulating layers for connection to active regions of said device, and an oxide layer having windows overlying said circuit metallization to expose areas of said metallization and bonding pads formed on said areas for external connection to said circuit metallization, the improvement comprising (1) a metal layer of a metal which acts as a barrier against migration of gold formed on and covering the surface of said bonding pads, (2) a protective layer extending over the edges of said insulating and oxide layers and in contact with the semiconductor body to seal the edges and environmentally protect said device, said protective layer having windows at said bonding pad areas, (3) sealing means for sealing the edges of said oxide layer windows to environmentally protect said devices, and (4) a gold layer formed on said metal layer for connecting to said bonding pads through said metal layer.

BRIEF DESCRIPTION OF THE DRAWINGS

The foregoing, and other objects of the invention, will be more clearly understood from the following description when read in connection with the accompanying drawings, of which.

DESCRIPTION OF PREFERRED EMBODIMENT(S)

Figure 1:
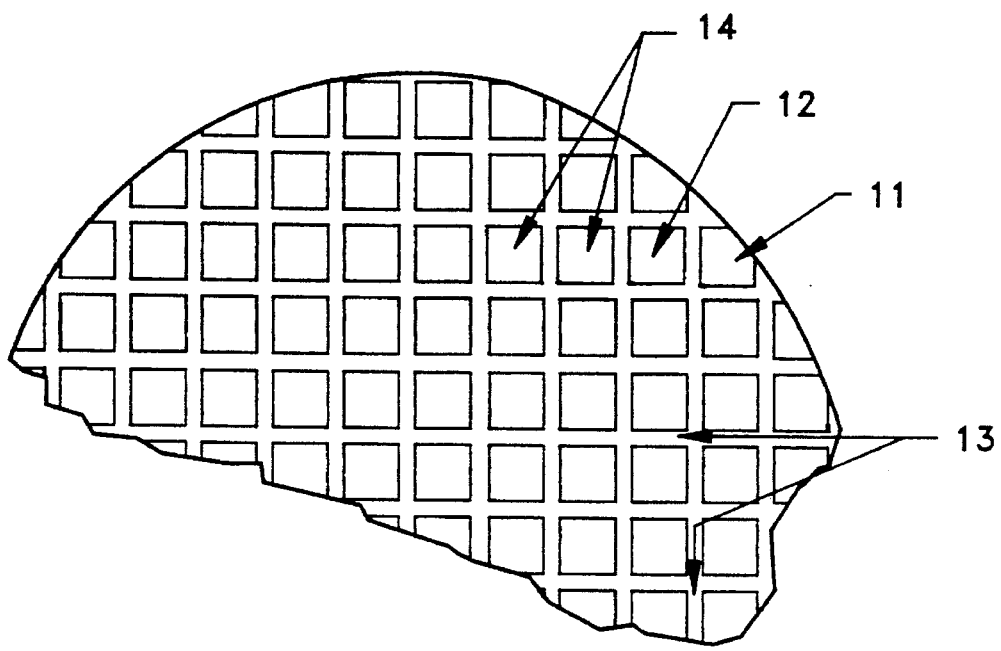
FIG. 1 is a plan view of a diced wafer mounted on a wafer processing fixture.
Figure 2:
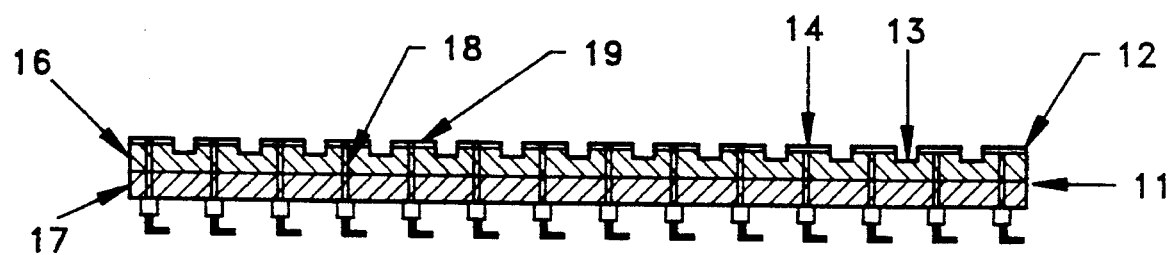
FIG. 2 is a sectional view of the diced wafer, disposable membrane and processing fixture shown in FIG. 1.
Figure 3:
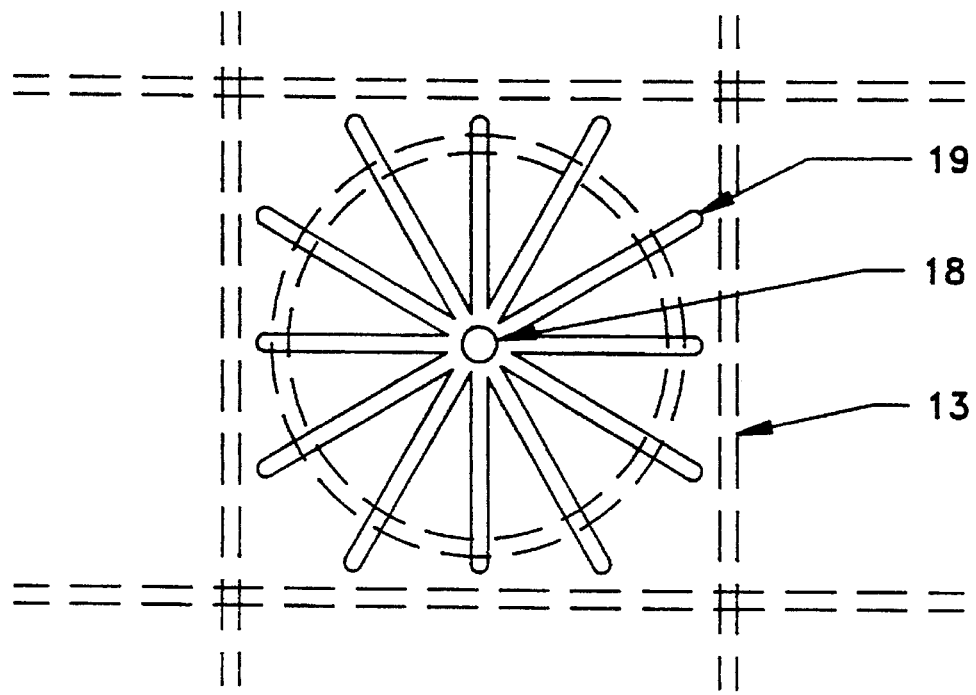
FIG. 3 is an enlarged plan view of the vacuum grooves formed in the disposable membrane associated with the processing fixture and serving to hold the individual dies.
Figure 4:
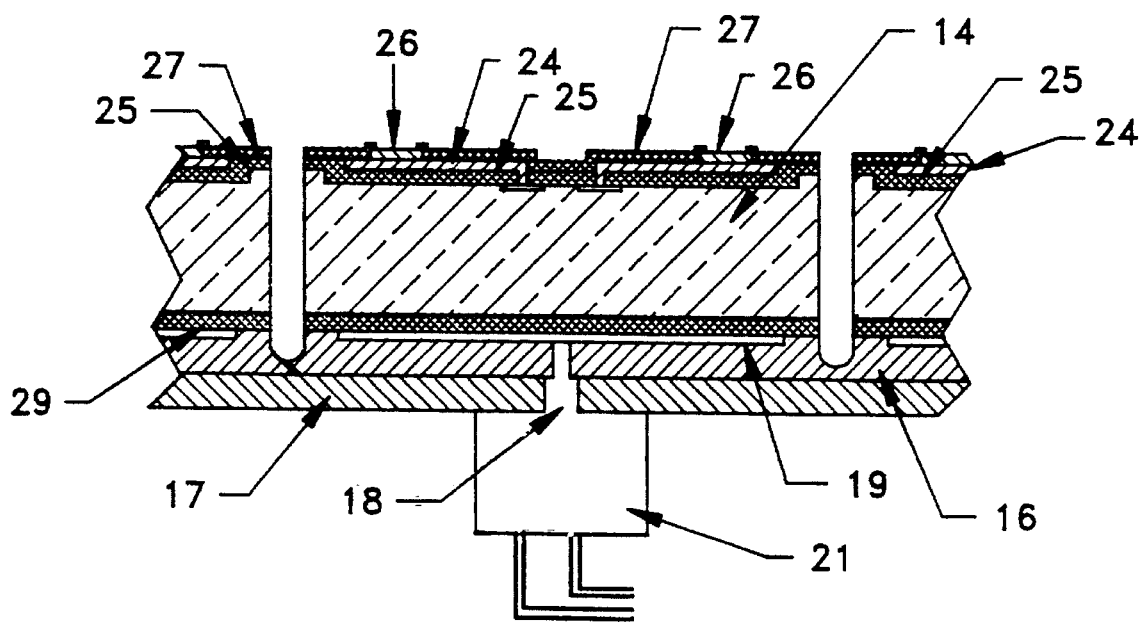
FIG. 4 is an enlarged sectional view of a portion of the mounting fixture shown in FIG. 3, showing in more detail the disposable membrane, dicing grooves and control valves for applying vacuum or pressure to the interface between the die and the disposable membrane.

Referring first to FIGS. 1–5, there is schematically illustrated a fixture for retaining a processed semiconductor wafer for dicing into individual dies and further processing to provide individual cocooned or hermetically sealed devices. Referring particularly to FIGS. 1 and 2, a fixture assembly 11 holds a wafer 12. The wafer has been cut by the saw cuts 13 to form individual dies represented by the areas 14. Prior to making the saw cuts, the wafer is independently processed in a conventional manner to form semiconductor devices or integrated circuits in each of the dies 14 with interconnecting metallization and bonding pads. The present invention is applicable to any device or integrated circuit and is directed to the hermetic cocooning or sealing of the device bonding pads formed on each of the individual dies or devices.

Figure 5:
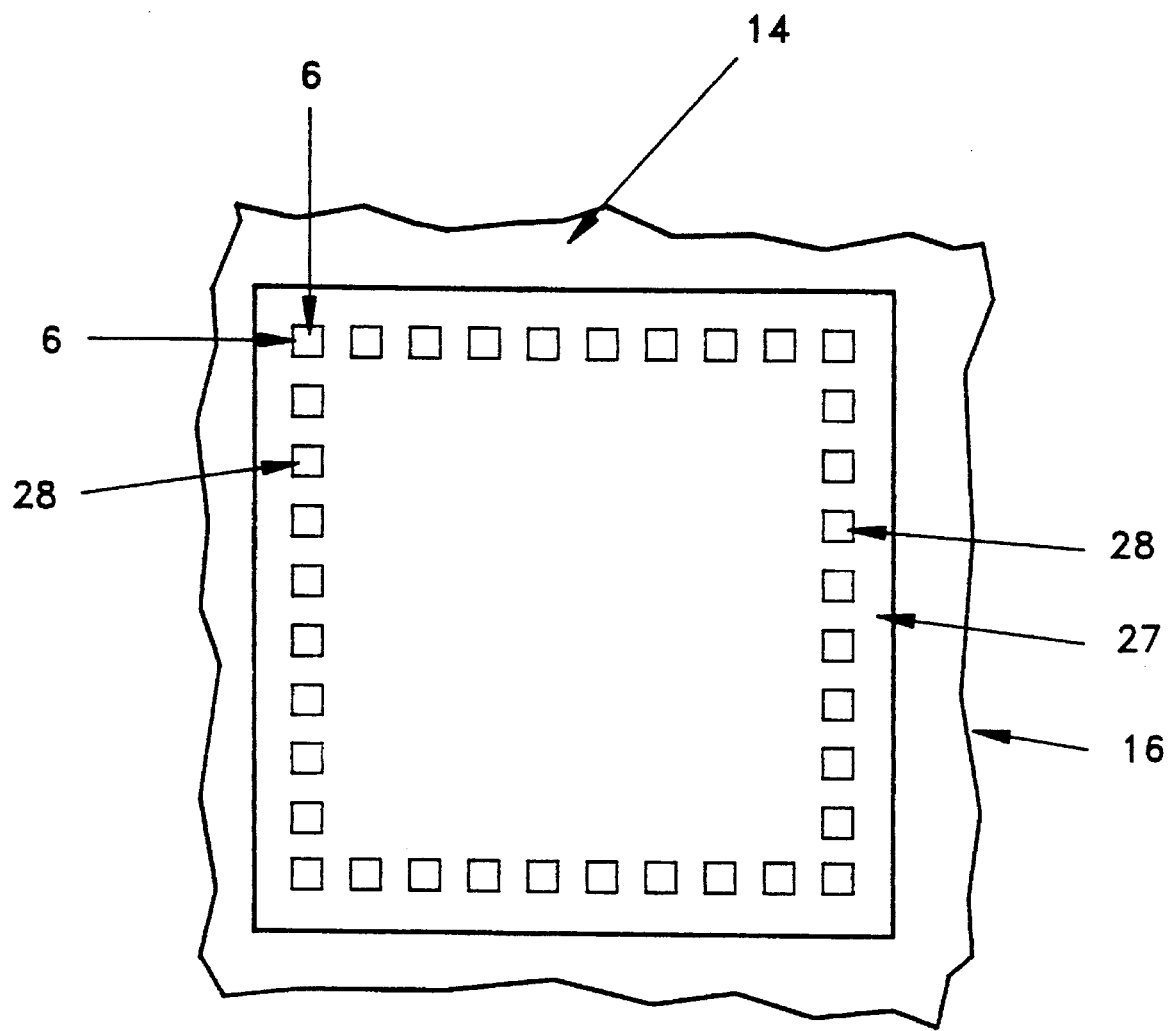
FIG. 5 is a top plan view of the die shown in FIG. 4 illustrating schematically the bonding pads.

More particularly, the wafer is supported on a disposable membrane 16 carried by base 17. The wafer is accurately positioned on the membrane and has its outer edges cemented to the membrane 16. As the wafer is diced to form the individual dies, they are drawn to the membrane by a vacuum or pushed away from the membrane by application of pressure by a control system to be described below. The base 17 includes a plurality of openings 18, one of which is shown on FIG. 4. The upper surface of the membrane 16 is grooved 19, FIG. 3, whereby, when a vacuum is applied by the control valve 21, the wafer and individual dies are held firmly against the membrane. After the wafer is positioned and vacuum applied to the grooves 19, the wafer is suitably diced as by sawing through the wafer into the membrane to separate the individual dies 14. The cuts 13 are clearly illustrated in FIGS. 1–4. Referring to the wafer shown in FIGS. 4–5, the wafer has been processed to form the semiconductor devices within the wafer. An aluminum thin film lead 24 supported on insulating layer 25 is connected to device areas. An aluminum bond pad 26 may be formed on the metal thin film lead 24. The metal layer 24 and bond pads are protected by an oxide passivation layer 27, for example, a silicon dioxide layer. The layer 27 has windows formed therein to expose bonding pad areas 28. During the dicing operation, the silicon dioxide insulating layer 25 and protective layer 27 may be chipped or damaged permitting moisture and other impurities to migrate into the semiconductor device or bonding pad area 28. This effect can be minimized by providing a space between the dicing cuts and the silicon dioxide insulating layer 25 and protective layer 27. The wafer shown in FIG. 4 may include a bottom silicon oxide and inorganic metallization protective layer 29. FIG. 5 is a top plan view of a die 14 supported on membrane 16 showing the bonding pad areas 28.

In accordance with the invention, the dies are simultaneously processed after dicing to hermetically seal the bonding pad area or to encapsulate the entire die including the bonding pad area to provide a semiconductor die or device 14 which does not need a separate ceramic or metal encapsulation to achieve chip hermeticity, that is, to protect the die from the ingress of moisture, harmful gases or other contamination or ions which deleteriously affect the semiconductor operation. In the processing, the base 17 is detached from the vacuum system and suitable valving retains the vacuum in the space 19 whereby to retain the individual dies.

Figure 6:
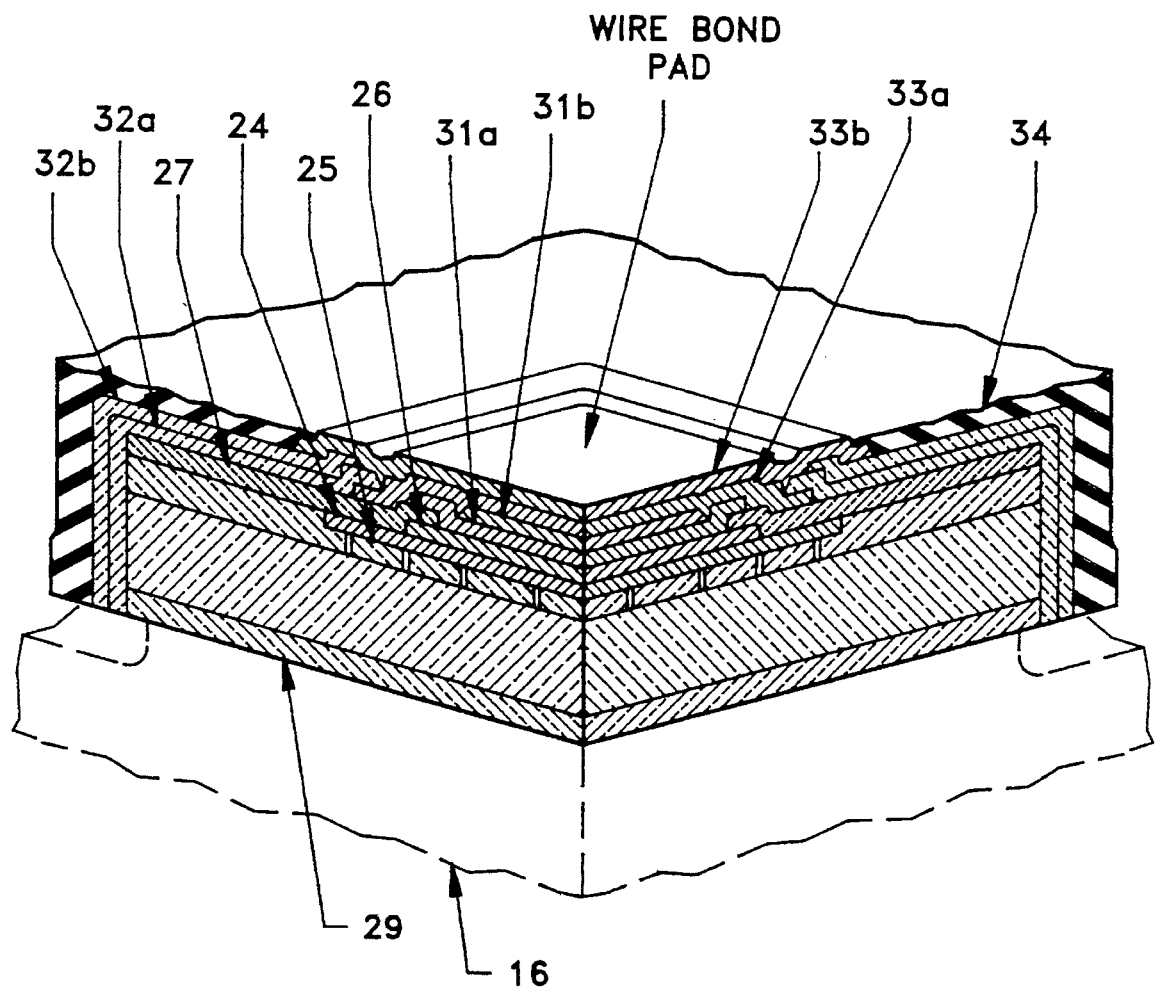
FIG. 6 is an enlarged view of a corner portion of the die shown in FIGS. 4 and 5, illustrating a wire bonding pad, which has been hermetically sealed by cocooning with insulating layers in accordance with one embodiment of this invention.

An enlarged perspective view taken generally along the lines 6—6, FIG. 5, of a portion of a cocooned or sealed device 14 showing a bonding pad area is illustrated in FIG. 6. As previously described the device includes an insulating passivation layer 25 which may comprise a silicon dioxide glass layer which supports a metal lead 24 which includes an aluminum bond pad 26. The lead 24 is connected to active regions in the device (not shown). A protective oxide layer 27 overlies the thin film metal leads 24 and the edge of the aluminum bond pad 26.

The aluminum bond pad is protected by metal barrier layer 31 such as titanium tungsten, which acts as a gold barrier. The barrier layer 31 preferably comprises two thin layers 31a, 31b to assure pinhole coverage which could be present in a thicker single barrier layer.

In accordance with one embodiment, a dielectric layer 32 is formed on the surface of the device and extend over the edges of the protective oxide coatings 25, 27 to contact the wafer and seal the edges, and over the exposed sides of the wafer to merge with the bottom layer 29 to completely encapsulate the device. Preferably, the dielectric layer comprises two thin silicon dioxide layers 32a, 32b, to provide better protection coverage. The layer 32 extends over the edge of the barrier layers 31 to seal the bonding pad area. A gold or other corrosion resistant bond pad 33 is formed over the barrier layer 31 and the window edges of the oxide layers 32a, 32b. The gold bond pad may also comprise two thin layers 33a, 33b to assure pinhole coverage. The barrier layer 31 prevents penetration of gold into the aluminum bonding pad and die. The gold bond pad 33 extends over the edges of the dielectric cocooning layer as well as the bond pad. A wire bond connection can be made to the gold bond pad 33.

The surface may be planarized by an organic encapsulation 34 such as a polymer which can be spun onto the die. The polymer layer also acts as a photon shield. Thus, the die is hermetically sealed and encapsulated by the application of the two oxide glass layers 32a, 32b which extend completely over the surface of the device except for the bonding pad area where it is sealed to the metal barrier layers which seal and protect the aluminum riser. The bond pad area is protected by the gold layers 33a, 33b which seal over the window edges of the oxide layers 32a, 32b. The overlapping layers protect against light or other high energy radiation.

The various layers may be formed by well-known techniques including masking, etching, vapor deposition, sputtering, and oxide growth.

Figure 7:
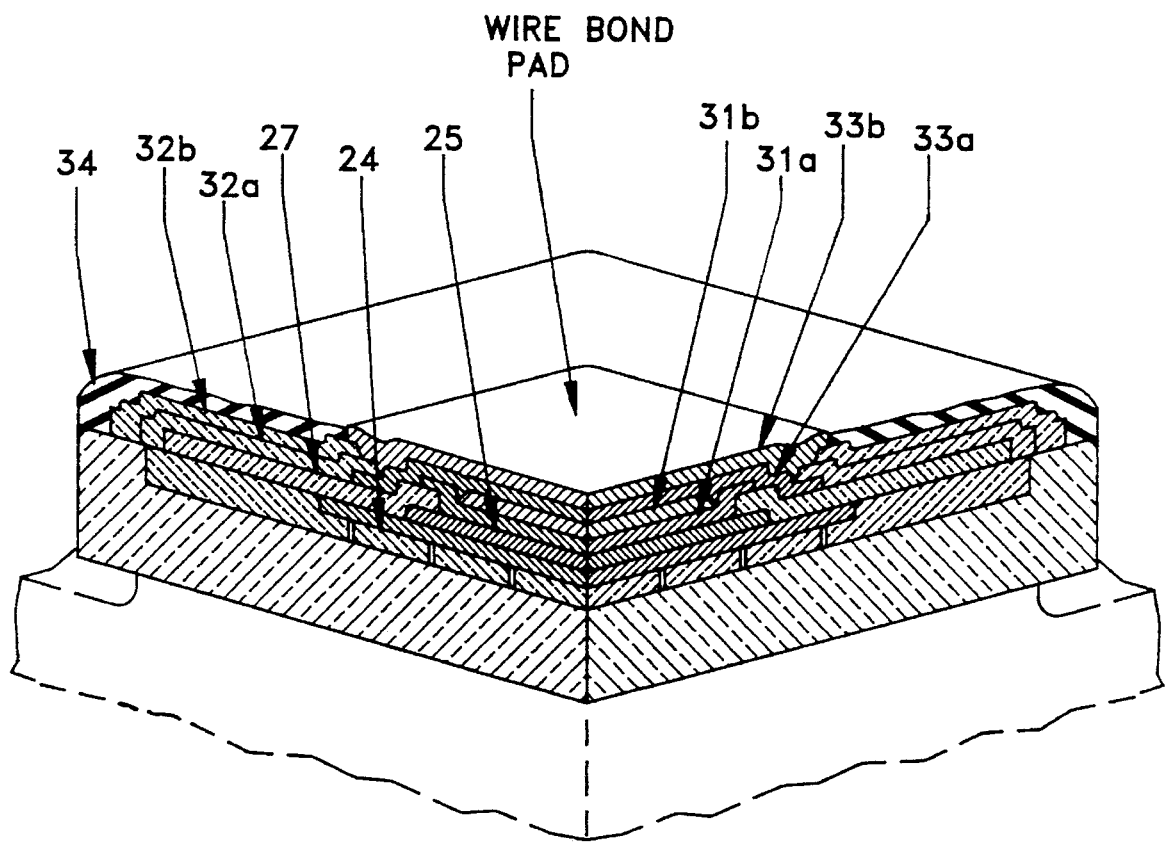
FIG. 7 is an enlarged view of a corner portion of a die illustrating a wire bonding pad which has been hermetically sealed by sealing the surface portions of the device in accordance with another embodiment of this invention.

In certain applications, it may not be necessary or desirable to completely encapsulate the semiconductor device. Protection is achieved by having the protective oxide glass layers extend over the edges of the passivation oxide layer 25 to seal the edges and over the barrier layer. It is preferable that the dicing cut be spaced from the edges of the passivation layer 25 and the protective layer 27, whereby cracks do not reach the passivation layer 25 and protective layer 27 and that any cracks are sealed by the protective oxide layer 32. In FIG. 7, where like reference numbers refer to like parts, there is shown a device which includes protective layers as in FIG. 6. The difference between the two devices is that the protective oxide or glass layers 32a, 32b extend only to and are in contact with the surface of the device whereby they encapsulate only the lead structure, layer 24 and passivation oxide layer 27. Likewise, the planarizing layer 34 extends only to the edge of the device. In other respects, the bonding pad area is sealed by the gold bonding pad layer, which overlaps the protective layer window edges to prevent the ingress of moisture or other contaminants by the oxide layers being sealed in relationship to the barrier layers 31a, 31b and in sealed relationship to the surface of the device, thereby preventing ingress of contaminants along the interface between the device and the lead structure or into the bonding pad area.

Figure 8:
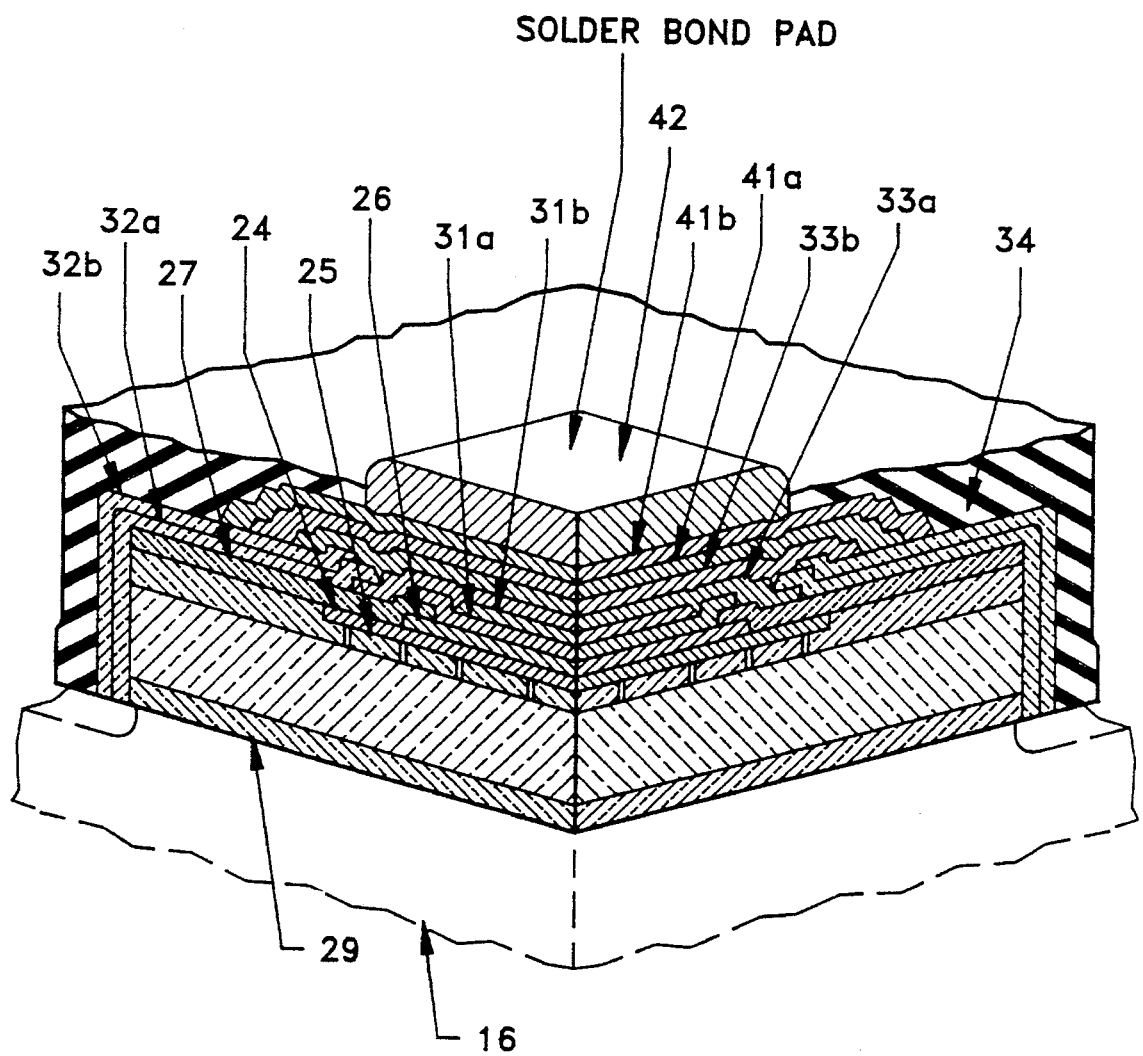
FIG. 8 is an enlarged view of a corner portion of a die which has been hermetically sealed by cocooning with insulating layers in accordance with a solder bonding embodiment of this invention.
Figure 9:
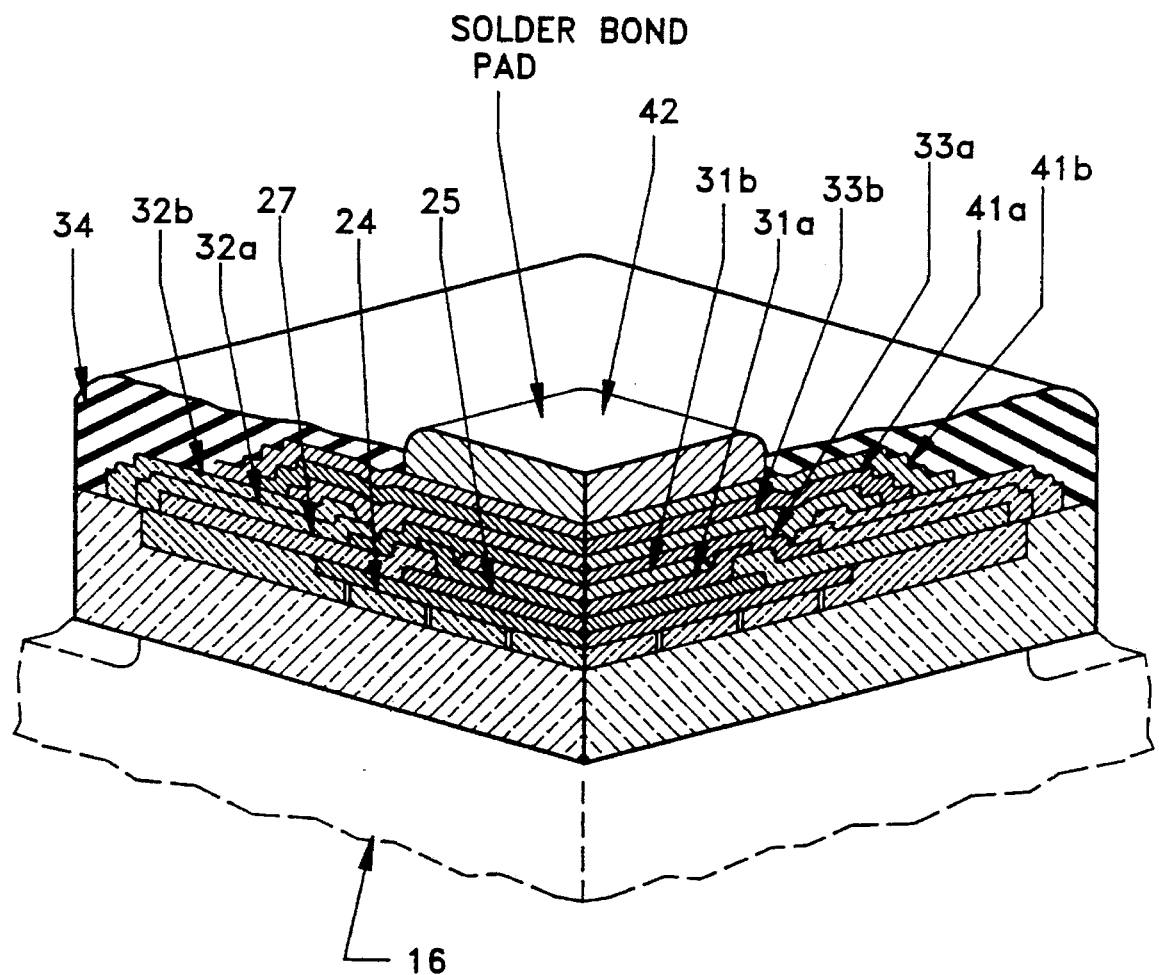
FIG. 9 is an enlarged view of a corner portion of a die in which surface portions have been hermetically sealed with insulating layers in accordance with a solder bonding embodiment of this invention.

If solder bonding rather than wire bonding is desired, a barrier layer is formed over the gold bond pad layer 33 to prevent the ingress of solder atoms into the gold layer 33. FIGS. 8 and 9 show the encapsulated devices of FIGS. 6 and 7, respectively, for solder bonding. Like reference numbers have been applied to like parts. In these embodiments, a barrier layer 41 of nickel, tungsten or the like, comprising preferably two thin layers 41a, 41b is applied over the gold bonding layer 33 and a solder bond pad 42 is formed on the surface.

Figure 10:
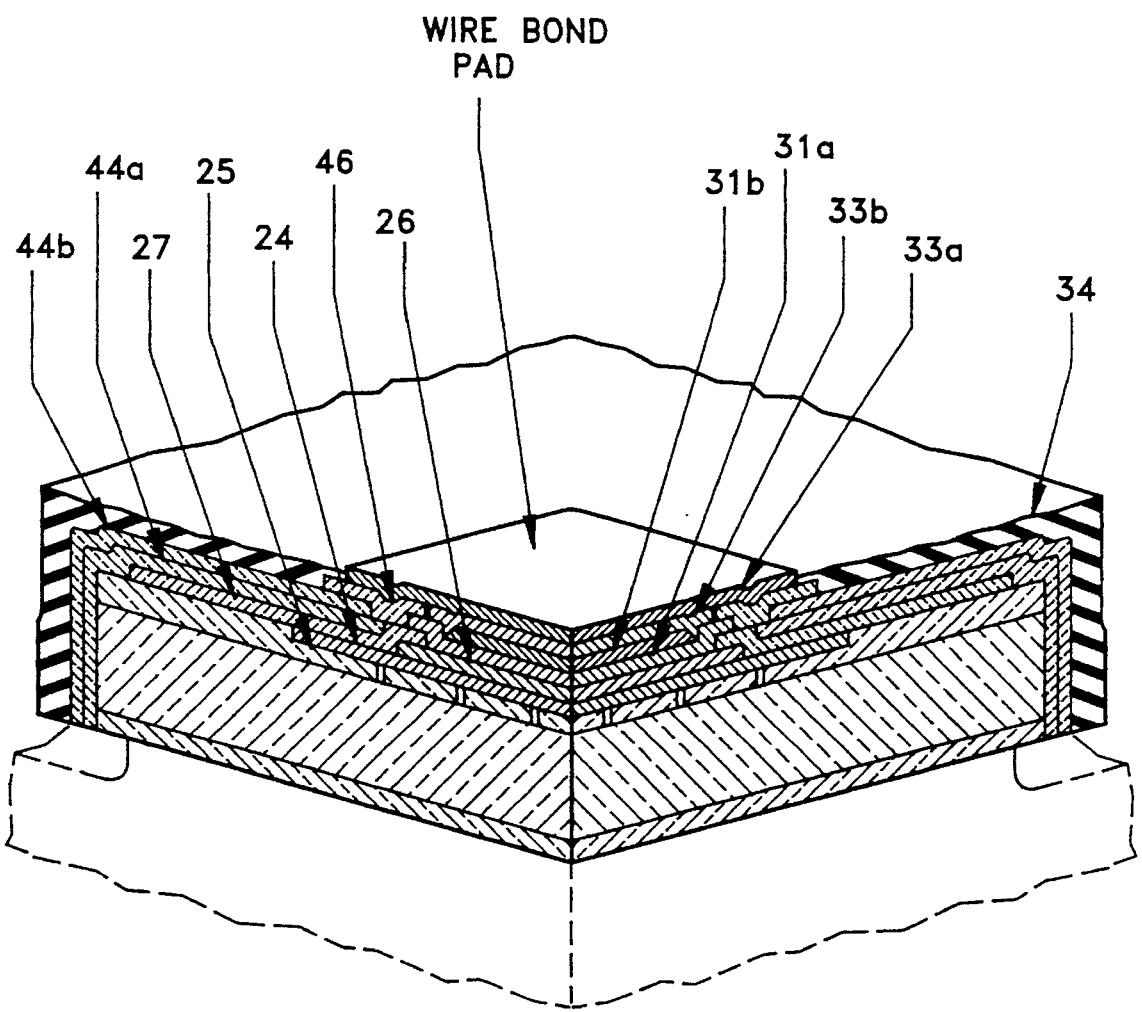
FIG. 10 is an enlarged view of a corner portion of a die which has been hermetically sealed by cocooning with metal layers in a wire bonding embodiment of this invention.
Figure 11:
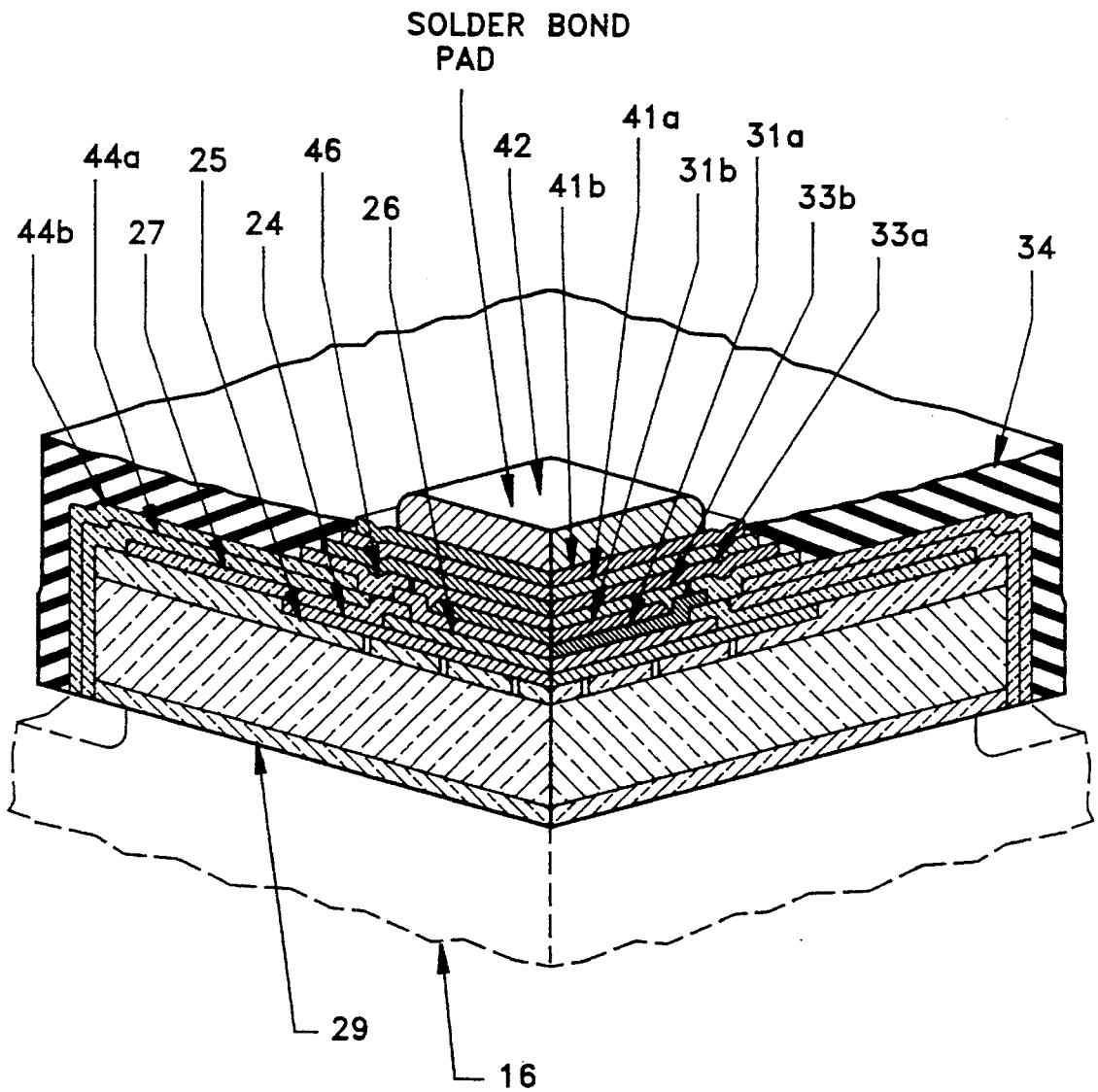
FIG. 11 is an enlarged view of a corner portion of a die with solder bonding pad which has been hermetically sealed by cocooning with metal layers in accordance with another embodiment of this invention.

The embodiment shown in FIG. 10 differs from the embodiment of FIG. 6 in that rather than protective insulating layers 32a, 32b, there are provided metal protective layers 44a, 44b. An insulating layer 46 extends over the window edges of the layers 44a, 44b to isolate the gold bond layers 33a, 33b from the layers 44a, 44b. The gold layers provide protection from the ingress of moisture or contaminants. Other layers are as previously described and bear like reference numbers. FIG. 11 shows the same construction for a solder bond device. Like reference numbers have been applied to like parts.

Figure 12:
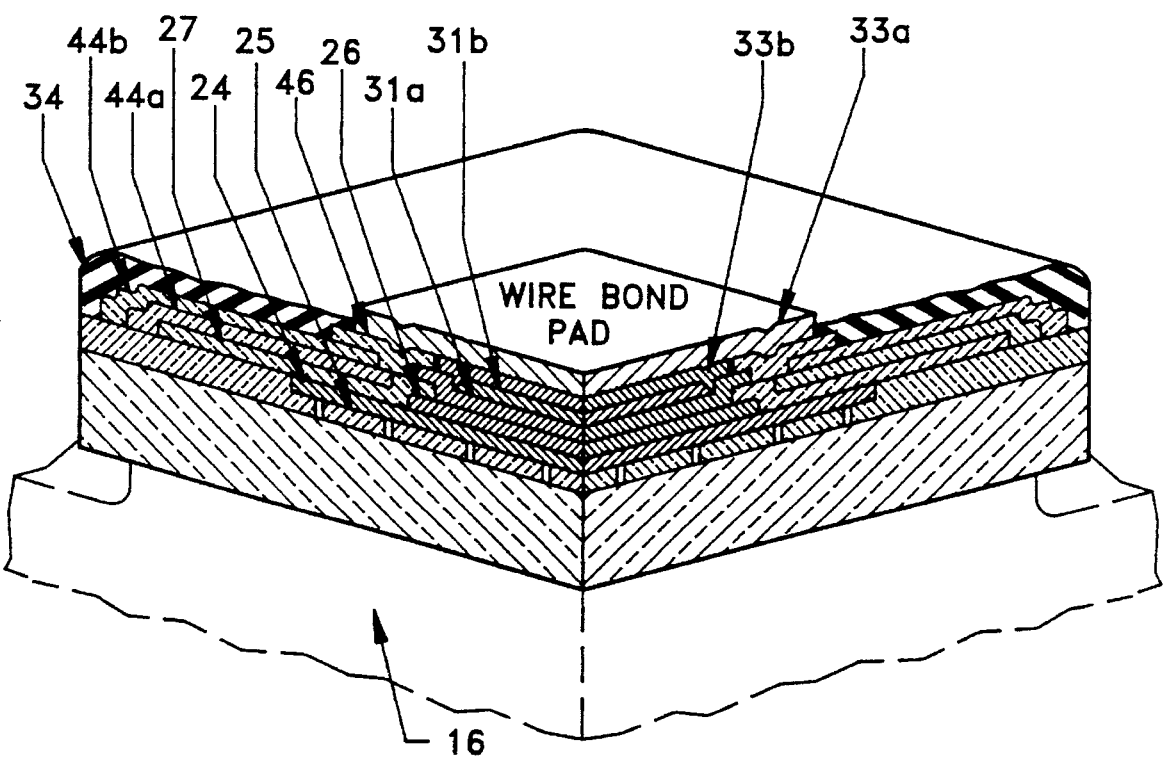
FIG. 12 is an enlarged view of a corner portion of a die of which the surface has been hermetically sealed with metal layers in accordance with another embodiment of this invention.
Figure 13:
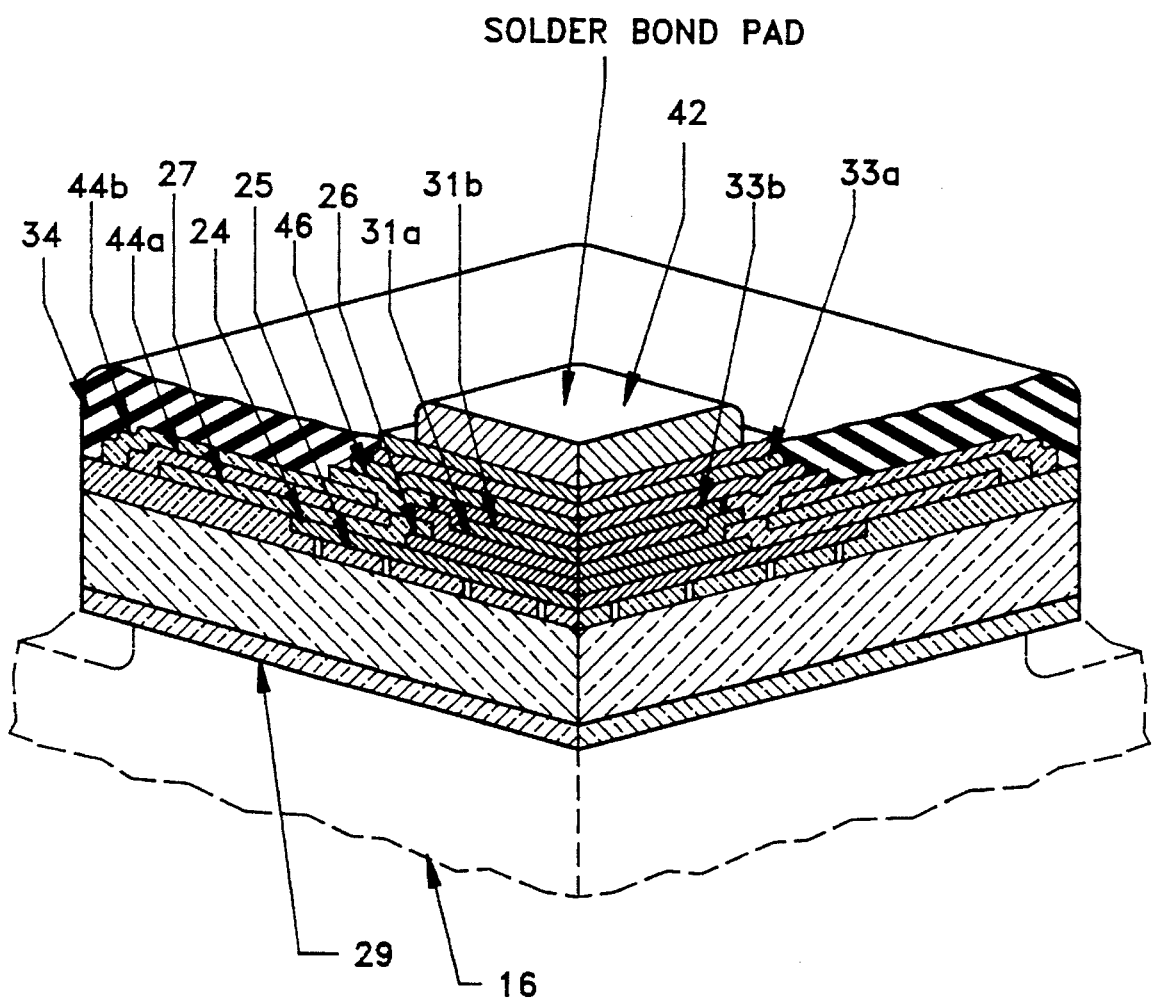
FIG. 13 is an enlarged view of a corner portion of a die in which the surface has been sealed with metal layers in a solder bonding embodiment of this invention.

FIGS. 12 and 13 shows the same devices as in FIGS. 10 and 11, with only surface encapsulation.

Figure 14:
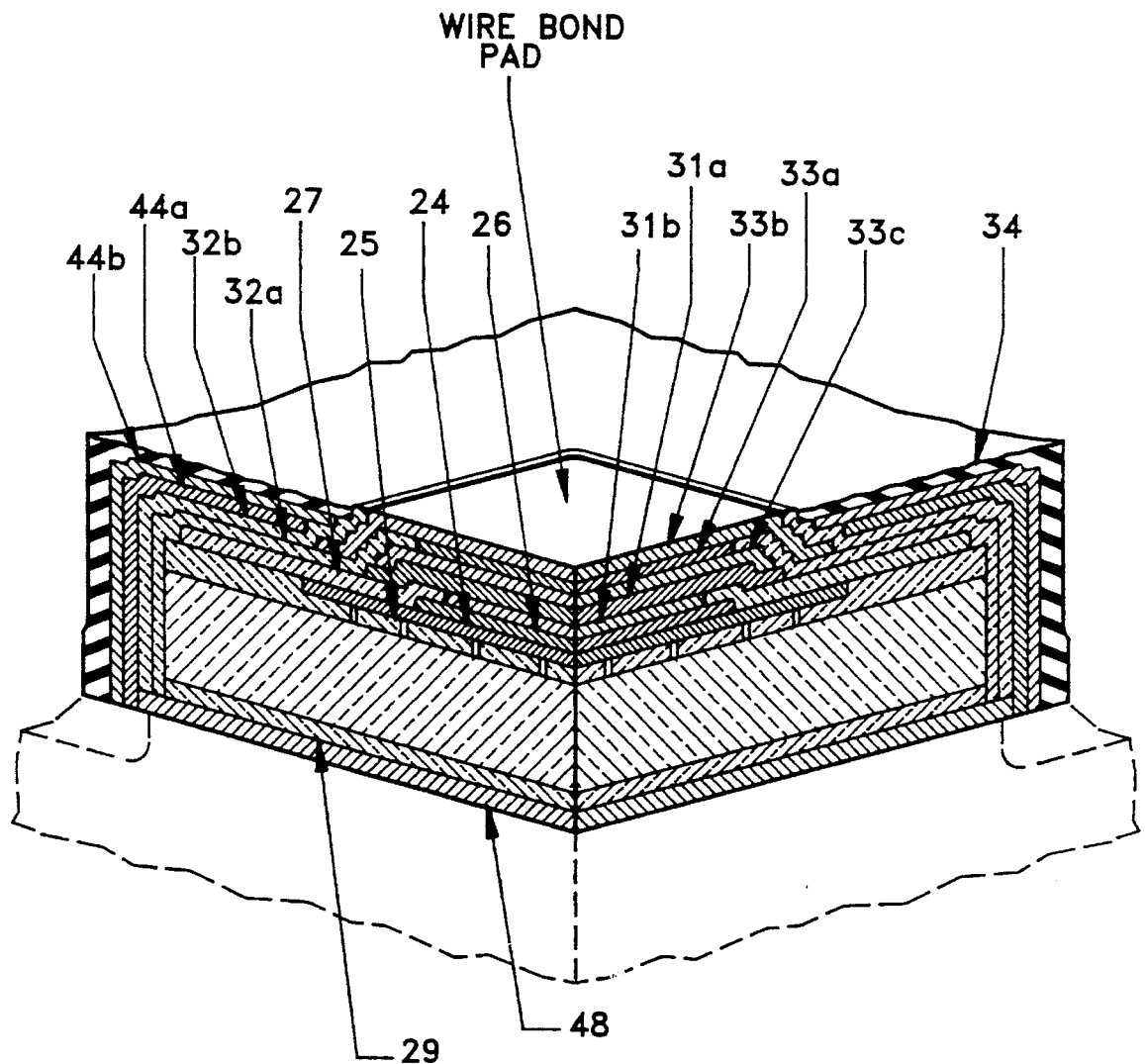
FIG. 14 is an enlarged view of a corner portion of a die which has been hermetically sealed by cocooning with insulating layers and metal layers.
Figure 15:
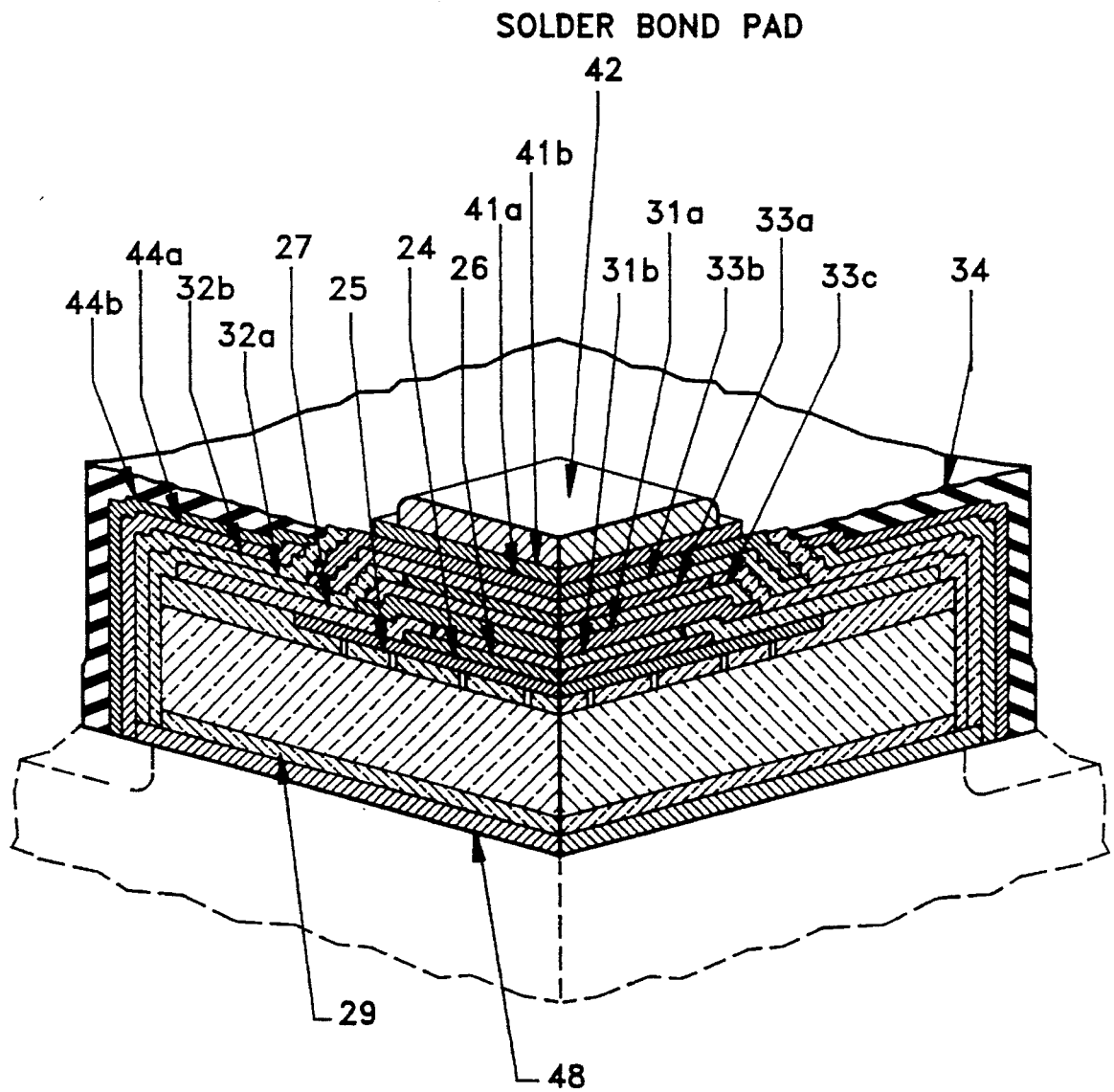
FIG. 15 is an enlarged view of a corner portion of a device as in FIG. 16 for solder bonding.
Figure 16:
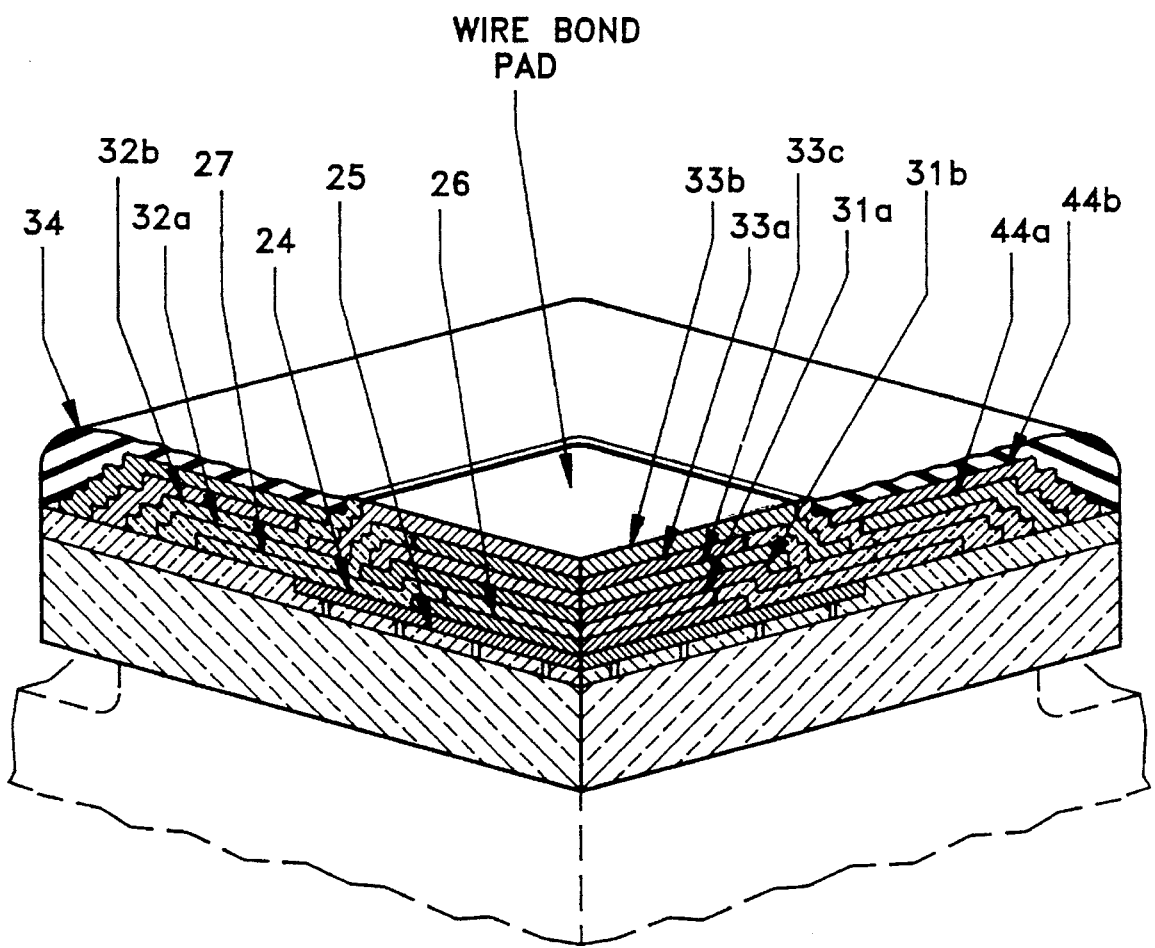
FIG. 16 is an enlarged view of a corner portion of a device similar to that of FIG. 12 in which the bonding pad is protected by insulating and metal layers.
Figure 17:
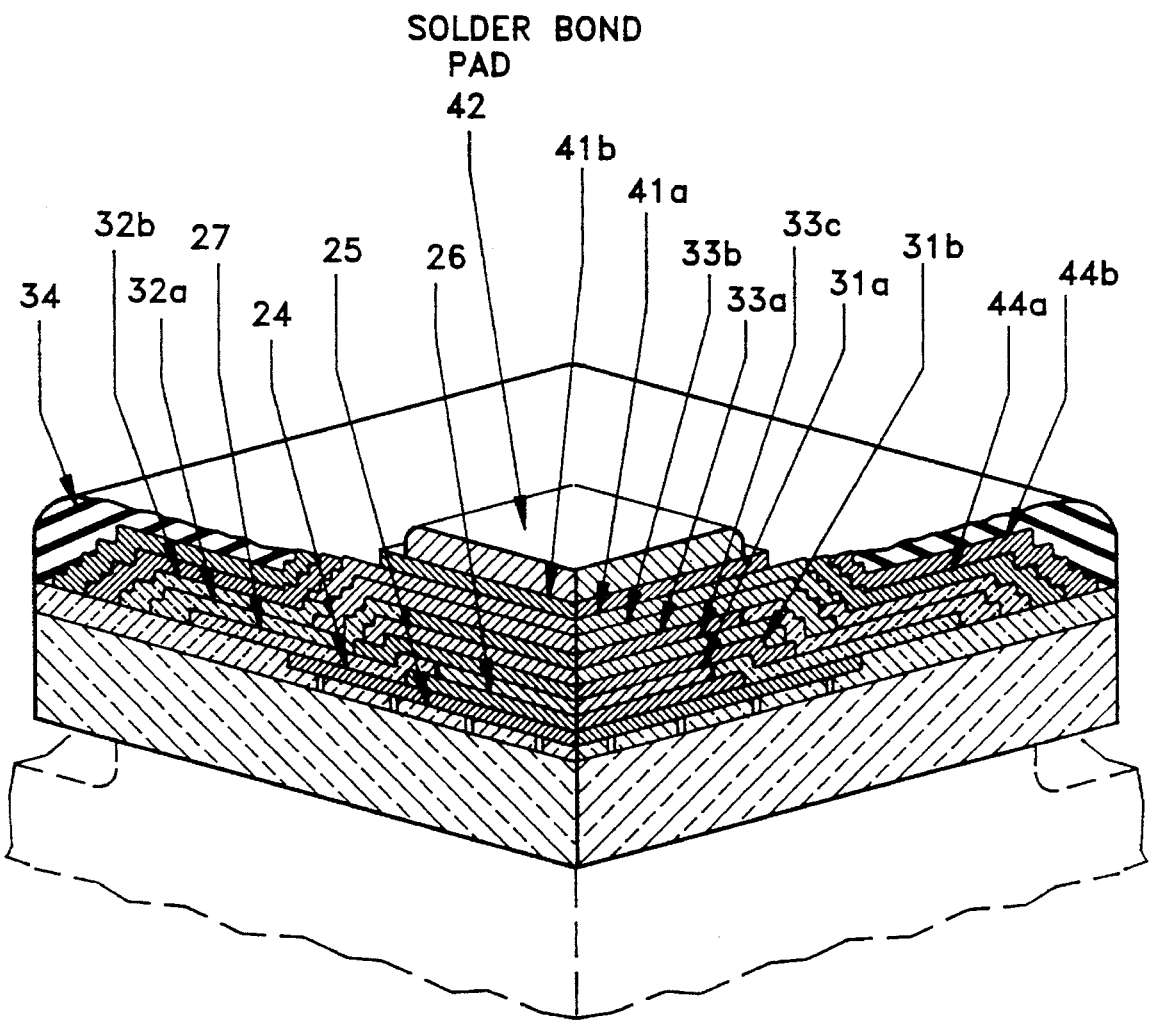
FIG. 17 is an enlarged view of a corner portion of a device similar to FIG. 17 in which the bonding pad is protected by insulating and metal layers.

A combination of protective insulating layers and metal protective layers afford enhanced protection. In FIG. 14 there is illustrated a device including a combination of metal and oxide protective layers. For ease of understanding, the layers have the same reference numbers for identical parts as described above, with the various embodiments. There is an additional gold layer 31c to achieve better leveling. The device includes a bottom metal layer 48 to completely metal encapsulate the device. FIG. 15 shows the same encapsulated device with solder bonding. FIGS. 16 and 17 show the surface protected versions of the same devices. The device of FIG. 16 also includes an additional layer 31c. The various embodiments shown can be more clearly understood from the following Table I which shows the type of bonding pad and type of protection.

| | Bond Pad Type | | Top Only Seating | | | Fully Cocooned Protection | | |
| --- | --- | --- | --- | --- | --- | --- | --- | --- |
| | | | Silicon | | Metal/SiO$_2$ | Silicon | | Metal/SiO$_2$ |
| FIG. Nos. | Wire (gold) | Tab (solder) | Dioxide (SiO$_2$) | Metal (N$_i$, W, etc.) | (radiation) (resist) | Dioxide (SiO$_2$) | Metal (N$_i$, W, etc.) | (radiation) (resist) |
| 6 | x | | | | | x | | |
| 7 | x | | x | | | x | | |
| 8 | | x | | | | x | | |
| 9 | | x | x | | | | | |
| 10 | x | | | | | | x | |
| 11 | | x | | | | | x | |
| 12 | x | | | x | | | | |
| 13 | | x | | x | | | | |
| 14 | x | | | | x | | | |
| 15 | | x | | | x | | | |
| 16 | x | | | | | | | x |
| 17 | | x | | | | | | x |

By adequately overlapping the metal layers separated by the silicon dioxide insulator, a ray of energy does not have free straight-line access to the metallization, thereby hardening the device from random alpha particles and light reactions.

In summary, all of the embodiments provide protection against ingress of moisture, harmful gases and other contaminants into the underlying semiconductor material by sealing the edges of the metallization protective oxide layer and over the edges of the bonding paid window in said layer. The protection is provided by silicon dioxide glass layers or metal layers or a combination thereof, and the gold bonding pad. The protection can be surface protection, or the complete device may be encapsulated.

What is claimed:

1. A semiconductor device which includes a semiconductor body having an upper surface, a lower surface and side surfaces extending between said upper and lower surfaces, said semiconductor body having circuit metallization carried by one or more insulating layers for connection to active regions of said device, and an oxide layer having inner edges defining windows overlying said circuit metallization to expose bonding pad areas of said metallization for connection to said active regions, said oxide layer and said insulating layers having outer edges spaced from said bonding pad areas, the improvement comprising a metal layer of a metal which acts as a barrier against migration of corrosion resistant metal formed on and covering said bonding pad areas, a protective layer extending over said outer edges of said insulating and oxide layers and in contact with said semiconductor body to seal said outer edges of said insulating and oxide layers and environmentally protect said device, said protective layer having inner edges defining windows at said bonding pad areas, a corrosion resistant metal layer formed on said metal layer for connecting to said bonding pad areas through said metal layer and for sealing said inner edges of said protective layer, and a bottom protective layer, said protective layer extending over said side surfaces of said semiconductor body to merge with the bottom protective layer to cocoon said device.

2. A semiconductor device as in claim 1 in which the corrosion resistant metal layer is gold.

3. A semiconductor device as in claim 2 in which said metal layer, protective layer and gold layer are multiple layers to provide pinhole coverage and in which at least one of the gold layers extends over said inner edges of at least one of the protective layers.

4. A semiconductor device as in claims 1, 2 or 3 in which said metal layer extends over said inner edges of said oxide layer and said protective layer is an insulating layer.

5. A semiconductor device as in claims 1, 2 or 3 in which said metal layer extends over said inner edges of said oxide layer and said protective layer is a silicon oxide layer.

6. A semiconductor device as in claims 1 or 2 in which said protective layer is a metal protective layer.

7. A semiconductor device as in claim 1 in which said protective layer comprises a metal protective layer and a silicon oxide layer and in which said corrosion resistant metal layer extends over said inner edges of at least one of the metal protective layer and the silicon oxide layer.

8. A semiconductor device as in claim 7 in which said metal layer, metal protective layer, corrosion resistant metal layer and silicon oxide layer comprise multiple layers to provide pinhole coverage and in which at least one of the corrosion resistant metal layers extends over said inner edges of at least one of the metal protective layers and silicon oxide layers.

9. A semiconductor device which includes a semiconductor body having upper and lower surfaces and side surfaces extending between said upper and lower surfaces, said semiconductor body having circuit metallization carried by one or more insulating layers for connection to active regions of said device, and an oxide layer having inner edges defining windows overlying said circuit metallization to expose bonding pad areas of said metallization for connection to said active regions, said oxide layer and said insulating layers having outer edges spaced from said bonding pad areas, the improvement comprising aluminum bonding pads on said metallization at said bonding pad areas, a layer of a metal which acts as a barrier against migration of gold formed on and covering said aluminum bonding pads, a protective layer having inner edges defining windows at said bonding pad areas, said protective layer extending over said outer edges of said insulating and oxide layers and contacting said semiconductor body to seal said outer edges of said insulating and oxide layers and environmentally protect said, device, sealing means for sealing said inner edges of said oxide layer to environmentally protect said device, a gold layer formed on said metal layer for connecting to said bonding pads through said metal layer, and a bottom protective layer, said protective layer extending over said side surfaces of said semiconductor body to merge with said bottom protective layer to cocoon the device.

10. A semiconductor device as in claim 9 in which said metal layer, protective layer and gold layer are multiple layers to provide pinhole coverage and in which at least one of the gold layers extends over said inner edges of at least one of the protective layers.

11. A semiconductor device as in claims 9 or 10 in which said metal layer has outer edges spaced from said bond pad area and in which said metal layer extends over said inner edges of said oxide layer and said protective layer is a dielectric insulating layer which extends over said outer edges of said metal layer to provide, in combination, said sealing means.

12. A semiconductor device as in claims 9 or 10 in which said metal layer has outer edges spaced from said bond pad area and in which said metal layer extends over said inner edges of said oxide layer and said protective layer is a silicon oxide layer which extends over said outer edges of said metal layer to provide, in combination, said sealing means.

13. A semiconductor device as in claim 9 in which said protective layer is a metal protective layer and said sealing means comprises an insulating layer which extends over said inner edges of said oxide layer and said inner edges of the metal protective layer.

14. A semiconductor device as in claim 9 in which said protective layer comprises a metal protective layer and a silicon oxide layer and in which said gold layer extends over said inner edges of at least one of the metal protective layer and the silicon oxide layer.

15. A semiconductor device as in claim 14 in which said metal layer, metal protective layer, gold layer and silicon oxide layer comprise multiple layers to provide pinhole coverage and in which at least one of the gold layers extends over said inner edges of at least one of the metal protective layers and silicon oxide layers.

16. A semiconductor device which includes a semiconductor body having upper and lower surfaces and side surfaces extending between said upper and lower surfaces, said semiconductor body having circuit metallization carried by one or more insulating layers for connection to active regions of said device, and an oxide layer having inner edges defining windows overlying said circuit metallization to expose bond pad areas of said metallization for connection to said active regions, said oxide layer and said insulating layers having outer edges spaced from said bond pad areas, the improvement comprising a first metal layer of a metal which acts as a barrier against migration of gold formed on and covering said bond pad areas, a protective layer extending over said outer edges of said insulating and oxide layers and in contact with the semiconductor body to seal said outer edges of said insulating and oxide layers and environmentally protect said device, said protective layer having inner edges defining windows at said bond pad areas, a gold layer formed on said first metal layer for connecting to said bond pad areas through said metal layer and for sealing said inner edges of said protective layer, a second metal layer which acts as a barrier against migration of solder covering said gold layer, a solder bond pad formed on said second metal layer, and a bottom protective layer, said protective layer extending over said surfaces of said semiconductor body to merge with the bottom protective layer to cocoon the device.

17. A semiconductor device as in claim 16 in which said first metal layer, protective layer and gold layer are multiple layers to provide pinhole coverage and in which at least one of the gold layers extends over said inner edges of at least one of the protective layers.

18. A semiconductor device as in claims 16 or 17 in which said metal layer extends over said inner edges of said oxide layer and said protective layer is an insulating layer.

19. A semiconductor device as in claims 16 or 17 in which said metal layer extends over said inner edges of said oxide layer and said protective layer is a silicon oxide layer.

20. A semiconductor device as in claims 16 in which said protective layer is a metal protective layer.

21. A semiconductor device as in claim 16 in which said protective layer comprises a metal protective layer and a silicon oxide layer and in which said gold layer extends over said inner edges of at least one of the protective metal layer and the silicon oxide layer.

22. A semiconductor device as in claim 21 in which said first and second metal layers, metal protective layer, gold layer and silicon oxide layer comprise multiple layers to provide pinhole coverage and in which at least one of the gold layers extends over said inner edges of at least one of the metal protective layers and silicon oxide layers.

23. A semiconductor device as in claims 1, 9 or 16 in which said protective layer comprises a metal protective layer and a silicon oxide layer extending over said side surfaces of said semiconductor body to merge with the bottom protective layer.

* * * * *